US012700654B2

(12) United States Patent
Ferguson et al.

(10) Patent No.: US 12,700,654 B2
(45) Date of Patent: Aug. 4, 2026

(54) TUNABLE COUPLER FOR COUPLING RESONANT CIRCUITS

(71) Applicant: NORTHROP GRUMMAN SYSTEMS CORPORATION, Falls Church, VA (US)

(72) Inventors: David George Ferguson, Takoma Park, MD (US); Jeremy Brendon Clark, Washington Township, OH (US); Micah John Atman Stoutimore, Rockville, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 103 days.

(21) Appl. No.: 18/757,163

(22) Filed: Jun. 27, 2024

(65) Prior Publication Data

US 2026/0005418 A1     Jan. 1, 2026

(51) Int. Cl.
*H01P 5/04* (2006.01)
*G01R 33/035* (2006.01)

(52) U.S. Cl.
CPC ............ *H01P 5/04* (2013.01); *G01R 33/0358* (2013.01)

(58) Field of Classification Search
CPC .............................. H01P 5/04; G01R 33/0358
USPC ......................................................... 333/99 S
See application file for complete search history.

(56) References Cited

U.S. PATENT DOCUMENTS

| | | | |
|---|---|---|---|
| 9,928,948 B2 | 3/2018 | Naaman et al. | |
| 10,042,805 B2 | 8/2018 | Naaman et al. | |
| 10,748,079 B2 * | 8/2020 | Boothby | H03M 1/0827 |
| 10,852,366 B2 * | 12/2020 | Ferguson | H10N 60/12 |

OTHER PUBLICATIONS

Campbell, et al.: "Modular Tunable Coupler for Superconducting Circuits"; American Physical Society; Physical Review Applied 19,064043 (2023); DOI: 10.1103/PhysRevApplied.19.064043; pp. 1-17.
Chen, et al.: "Qubit Architecture with High Coherence and Fast Tunable Coupling"; Physical Review Letters; PRL 113, 220502 (2014); Nov. 28, 2014; DOI: 10.1103/PhysRevLett.113.220502, pp. 1-2.

(Continued)

*Primary Examiner* — Andrea Lindgren Baltzell
*Assistant Examiner* — Abigail Amir Yaldo
(74) *Attorney, Agent, or Firm* — Tarolli, Sundheim, Covell & Tummino LLP

(57) ABSTRACT

A tunable coupler circuit includes a first transmission line, a second transmission line and a three-junction superconducting quantum interference device (SQUID) coupled between the first transmission line and the second transmission line. The three-junction SQUID includes a first Josephson Junction (JJ), a second JJ and a center JJ coupled in parallel to one another such that the first JJ and the center JJ forms a first loop and the second JJ and the center JJ forms a second loop. A resonant frequency of the tunable coupler circuit is tuned based on applying a first flux and a second flux to the first and second loops.

20 Claims, 5 Drawing Sheets

(56) References Cited

OTHER PUBLICATIONS

Srinivasan, et al.: "Tunable Coupling in Circuit Quantum Electro-dynamics Using a Superconducting Charge Qubit iwth a V-Shaped Energy Level Diagram"; Physical Review Letters; PRL106, 083601 (2011); Feb. 25, 2011; DOI: 10.1103/PhysRevLett.106.083601; pp. 1-4.

Majer, et al.: "Coupling Superconducting Qubits Via a Cavity Bus"; Nature Publishing Group; vol. 449, Sep. 27, 2007; DOI: 10.1038/nature06184; pp. 443-447.

\* cited by examiner

TUNABLE COUPLER FOR COUPLING RESONANT CIRCUITS

GOVERNMENT INTEREST

The invention was made under Government Contract. Therefore, the US Government has rights to the invention as specified in that contract.

TECHNICAL FIELD

This disclosure relates generally to superconductor circuits, and specifically to tunable coupler for coupling resonant circuits.

BACKGROUND

Efficient coupling between resonant circuits is a key step in the scaling of superconducting platforms. Fast and well-controlled tunable coupler circuits will be essential to achieve efficient coupling between resonant circuits in superconducting computing applications. By tuning one or more parameters of the tunable coupler circuit, a desired coupling between the resonant circuits may be achieved. A SQUID (superconducting quantum interference device) is a very sensitive magnetometer used to measure extremely weak magnetic fields, based on superconducting loops containing Josephson junctions. A SQUID may also act as a tunable inductor based on applying one or more external control parameters. In some examples, a tunable coupler circuit may be realized by using a SQUID.

SUMMARY

One example of the disclosure includes a tunable coupler circuit that includes a first transmission line, a second transmission line; and a three-junction superconducting quantum interference device (SQUID) coupled between the first transmission line and the second transmission line. The three-junction SQUID includes a first Josephson Junction (JJ), a second JJ and a center JJ coupled in parallel to one another such that the first JJ and the center JJ forms a first loop and the second JJ and the center JJ forms a second loop. A resonant frequency of the tunable coupler circuit is tuned based on applying a first flux and a second flux to the first and second loops.

Another example of the disclosure includes a system including a first resonant circuit having a first resonant frequency, a second resonant circuit having a second resonant frequency; and a tunable coupler circuit coupled between the first resonant circuit and the second resonant circuit. The tunable coupler circuit includes a first transmission line; a second transmission line; and a three-junction superconducting quantum interference device (SQUID) coupled between the first transmission line and the second transmission line. The three-junction SQUID includes a first Josephson Junction (JJ), a second JJ and a center JJ coupled in parallel to one another such that the first JJ and the center JJ forms a first loop and the second JJ and the center JJ forms a second loop. A coupling rate between the first resonant circuit and the second resonant circuit is determined based on tuning a resonant frequency of the tunable coupler circuit.

DETAILED DESCRIPTION

Figure 1:
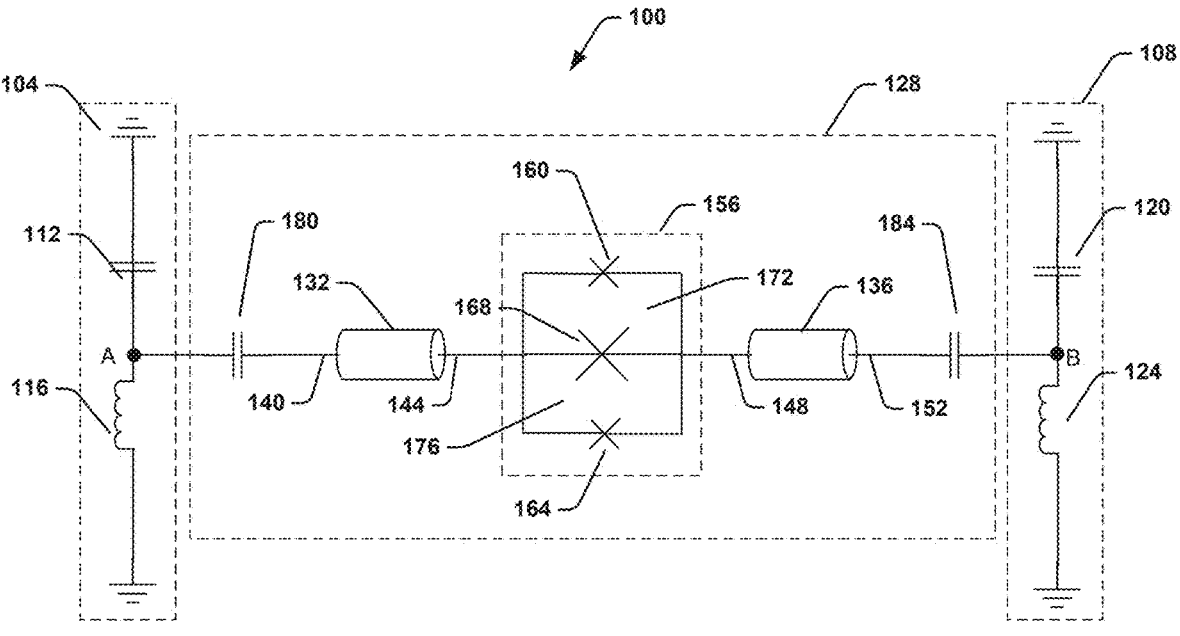
FIG. 1 illustrates an example system.

This disclosure relates to tunable coupler circuits, and specifically to tunable coupler circuits that utilize superconducting quantum interference devices (SQUIDs) as tunable inductors. Tunable coupler circuits are utilized to facilitate communication/coupling between two resonant circuits (e.g., two superconductor computing circuits). In some examples, a resonant frequency of the tunable coupler circuit is tuned/modified to modulate the coupling between the two resonant circuits. In particular, when the resonant frequency of the tunable coupler circuit is tuned/modified to be near or at the resonant frequency of the two resonant circuits, the tunable coupler circuit is turned on, thereby facilitating communication/coupling between the two resonant circuits. Further, when the resonant frequency of the tunable coupler circuit is tuned/modified to be farther away from the resonant frequency of the two resonant circuits, the tunable coupler circuit is turned off, thereby hindering communication/coupling between the two resonant circuits.

An example tunable coupler circuit includes a first transmission line and a second transmission line. In some examples, the first transmission line and the second transmission line are configured as quarter wavelength transmission lines. The tunable coupler circuit further includes a three-junction superconducting quantum interference device (SQUID) coupled between the first transmission line and the second transmission line. The three-junction SQUID includes a first Josephson Junction (JJ), a second JJ and a center JJ coupled in parallel to one another such that the first JJ and the center JJ forms a first loop and the second JJ and the center JJ forms a second loop. In some examples, a resonant frequency of the tunable coupler circuit is tuned based on applying a first flux and a second flux to the first and second loops. In particular, an effective inductance of the three-junction SQUID is varied by applying the first flux and the second flux, which in turn varies the resonant frequency of the tunable coupler circuit.

In some examples, the tunable coupler circuit is coupled between two resonant circuits to facilitate communication/coupling between the two resonant circuits. In some examples, the tunable coupler circuit determines the coupling rate between the two resonant circuits based on tuning the resonant frequency of the tunable coupler circuit. In particular, the coupling rate between the two resonant circuits is varied based on varying the effective inductance of the three-junction SQUID. In some examples, the first transmission line and the second transmission line are configured as quarter wavelength transmission lines to keep the resonant frequency of the tunable coupler circuit to be relatively higher compared to the resonant frequencies of the two resonant circuits (when the first flux and the second flux are not applied). Therefore, when the first flux and the second flux are not applied, the coupling rate between the two resonant circuits is minimum and therefore, the tunable coupler circuit is in off-state. In the off-state of the tunable coupler circuit, the coupling/communication between the two resonant circuits is disabled. Upon applying the first flux and the second flux, the effective inductance of the three-junction SQUID gradually increases, thereby bringing down the resonant frequency of the tunable coupler circuit to be near/equal to the resonant frequency of the two resonant circuits. When the resonant frequency of the tunable coupler circuit becomes near/equal to the resonant frequency of the two resonant circuits, the coupling rate between the two resonant circuit is increased to an extent that the tunable coupler circuit is in on-state. In the on-state of the tunable coupler circuit, the coupling/communication between the two resonant circuits is enabled.

In some examples, the first flux sets a maximum inductance of the three-junction SQUID and the second flux sets the effective inductance of the three-junction SQUID. More particularly, for a particular value of the first flux, even if the second flux is increased beyond a certain limit, the effective inductance of the three-junction SQUID would not increase beyond the maximum inductance. In some examples, the effective inductance of the three-junction SQUID starts decreasing from the maximum inductance when the second flux is further increased. Therefore, utilizing the three-junction SQUID can be configured to set a maximum effective inductance for the three-junction SQUID that is flux-insensitive (e.g., insensitive to the value of the second flux), thereby allowing to have a flux-insensitive maximum coupling rate (sometimes referred to as a sweet spot). In other words, based on the values of the first flux and the second flux, a flux-insensitive maximum coupling rate can be achieved, when using the three-junction SQUID. In some examples, setting the maximum effective inductance of the three-junction SQUID can be configured to achieve a broad on-state for the tunable coupler circuit. In other words, since the maximum effective inductance of the three-junction SQUID is set, with the increase in the value of the second flux, the effective inductance of the three-junction SQUID gradually increases to reach the maximum effective inductance and then gradually decreases such that the tunable coupler circuit in resonance with the two resonant circuits for a broad range of values of the second flux.

FIG. 1 illustrates an example system 100. The system 100 includes a first resonant circuit 104 and a second resonant circuit 108. The first resonant circuit 104 has a first resonant frequency and the second resonant circuit 108 has a second resonant frequency. In some examples, the first resonant frequency and the second resonant frequency are the same or near to one another. The first resonant circuit 104 includes a first capacitor 112 and a first inductor 116. The second resonant circuit 108 includes a second capacitor 120 and a second inductor 124. However, in other examples, the first resonant circuit 104 and the second resonant circuit 108 may include different combinations of inductors, capacitors, Josephson junctions (JJs) and resistors.

The system 100 further includes a tunable coupler circuit 128 coupled between the first resonant circuit 104 and the second resonant circuit 108. The tunable coupler circuit 128 includes a first transmission line 132 and a second transmission line 136. The first transmission line 132 has a first end 140 and a second end 144. In some examples, the first transmission line 132 includes a quarter wavelength transmission line. Similarly, the second transmission line 136 includes a first end 148 and a second end 152. In some examples, the second transmission line 136 includes a quarter wavelength transmission line. The tunable coupler circuit 128 further includes a three-junction superconducting quantum interference device (SQUID) 156 coupled between the first transmission line 132 and the second transmission line 136. In particular, the three-junction SQUID 156 is coupled between the second end 144 of the first transmission line 132 and the first end 148 of the second transmission line 136.

The three-junction SQUID 156 includes a first Josephson Junction (JJ) 160, a second JJ 164 and a center JJ 168 coupled in parallel to one another such that the first JJ 160 and the center JJ 168 forms a first loop 172 and the second JJ 164 and the center JJ 168 forms a second loop 176. In some examples, a sum of a critical current associated with the first JJ 160 and a critical current associated with the second JJ 164 is greater than a critical current associated with the center JJ 168. Further, in some examples, each of the critical current associated with the first JJ 160 and the critical current associated with the second JJ 164 is less than the critical current associated with the center JJ 168. Alternately, in other examples, the critical current associated with the first JJ 160 or the critical current associated with the second JJ 164 or both may be greater than the critical current associated with the center JJ 168. The tunable coupler circuit 128 further includes a first coupling capacitor 180 (e.g., 1 fF or 2 fF) that is coupled to the first end 140 of the first transmission line 132 at one end and is coupled to a node A of the first resonant circuit 104 at the other end. Furthermore, the tunable coupler circuit 128 includes a second coupling capacitor 184 (e.g., about 1 fF to about 2 fF) that is coupled to the second end 152 of the second transmission line 136 at one end and is coupled to a node B of the second resonant circuit 108 at the other end.

In some examples, the tunable coupler circuit 128 is configured to selectively enable and disable coupling/communication between the first resonant circuit 104 and the second resonant circuit 108. In particular, a coupling rate between the first resonant circuit 104 and the second resonant circuit 108 is determined based on tuning/modifying a resonant frequency of the tunable coupler circuit 128. For example, the coupling rate between the first resonant circuit 104 and the second resonant circuit 108 increases when a detuning frequency decreases. Further, the coupling rate between the first resonant circuit 104 and the second resonant circuit 108 decreases when the detuning frequency increases. The detuning frequency is the difference between the resonant frequency of the tunable coupler circuit 128 and the first resonant frequency of the first resonant circuit 104 or the second resonant frequency of the second resonant circuit 108 or an average of the first resonant frequency and the second resonant frequency.

The detuning frequency decreases when the resonant frequency of the tunable coupler circuit 128 is modified/tuned such that the resonant frequency of the tunable coupler circuit 128 is equal to or near the first resonant frequency or the second resonant frequency or an average of the first resonant frequency and the second resonant frequency. In such instances, the coupling rate between the first resonant circuit 104 and the second resonant circuit 108 is increased, thereby enabling coupling/communication between the first resonant circuit 104 and the second resonant circuit 108. Similarly, the detuning frequency increases when the resonant frequency of the tunable coupler circuit 128 is modified/tuned such that the resonant frequency of the tunable coupler circuit 128 is farther away from the first resonant frequency or the second resonant frequency or an average of the first resonant frequency and the second resonant frequency. In such instances, the coupling rate between the first resonant circuit 104 and the second resonant circuit 108 is decreased, thereby disabling coupling/communication between the first resonant circuit 104 and the second resonant circuit 108.

In some examples, the resonant frequency of the tunable coupler circuit 128 is modified/tuned based on applying a first flux and a second flux to the first loop 172 and the second loop 176 of the three-junction SQUID 156. In some examples, the tunable coupler circuit 128 further includes a first bias line (not shown) to apply the first flux to the first loop 172 and the second loop 176. Further, the tunable coupler circuit 128 includes a second bias line (not shown) to apply the second flux to the first loop 172 and the second loop 176. In some examples, the first flux causes a first loop current (not shown) to flow in the first loop 172 and a second loop current (not shown) to flow in the second loop 176 such that the first loop current and the second loop current flow in opposite directions through the center JJ 168. Further, in some examples, the second flux causes a third loop current (not shown) to flow in the first loop 172 and a fourth loop current (not shown) to flow in the second loop 176 such that the third loop current and the fourth loop current flow in the same direction through the center JJ 168.

In some examples, the first flux determines a maximum inductance of the three-junction SQUID 156 and the second flux determines an effective inductance (or actual inductance) of the three-junction SQUID 156. The effective inductance of the three-junction SQUID 156 is less than or equal to the maximum inductance of the three-junction SQUID 156. In some examples, the resonant frequency of the tunable coupler circuit 128 is determined by the effective inductance of the three-junction SQUID 156. In particular, the resonant frequency of the tunable coupler circuit 128 is inversely proportional to the effective inductance of the three-junction SQUID 156. Therefore, when the effective inductance of the three-junction SQUID 156 is increased, the resonant frequency of the tunable coupler circuit 128 is decreased and vice versa.

In some examples, a value of the second flux is varied for a given value of the first flux to vary the effective inductance of the three-junction SQUID 156. In some examples, providing the first flux sets the maximum inductance of the three-junction SQUID 156 such that the effective inductance of the three-junction SQUID 156 do not exceed the maximum inductance for any value of the second flux. In particular, in some examples, the effective inductance of the three-junction SQUID 156 increases with the increase in the value of the second flux up to the maximum inductance and then the effective inductance decreases with a further increase in the value of the second flux.

In some examples, the tunable coupler circuit 128 is configured such that when the effective inductance of the three-junction SQUID 156 is at a low value (e.g., when the first flux and the second flux are not applied), the resonant frequency of the tunable coupler circuit 128 is higher than the first resonant frequency of the first resonant circuit 104 or the second resonant frequency of the second resonant circuit 108 or an average of the first resonant frequency and the second resonant frequency, thereby establishing a low coupling rate (e.g., low coupling or zero coupling) between the first resonant circuit 104 and the second resonant circuit 108. In some examples, configuring the first transmission line 132 and the second transmission line 136 as quarter wavelength transmission lines enables to keep the resonant frequency of the tunable coupler circuit 128 relatively higher compared to the first resonant frequency of the first resonant circuit 104 or the second resonant frequency of the second resonant circuit 108 or the average of the first resonant frequency and the second resonant frequency, when the effective inductance of the three-junction SQUID 156 is at the low value. Therefore, in such examples, the effective inductance of the three-junction SQUID 156 is increased from the low value to a high value (e.g., by applying the first flux and the second flux) such that the resonant frequency of the tunable coupler circuit 128 is equal to or near the first resonant frequency of the first resonant circuit 104 or the second resonant frequency of the second resonant circuit 108 or an average of the first resonant frequency and the second resonant frequency, thereby establishing a high coupling rate between the first resonant circuit 104 and the second resonant circuit 108.

Figure 2:
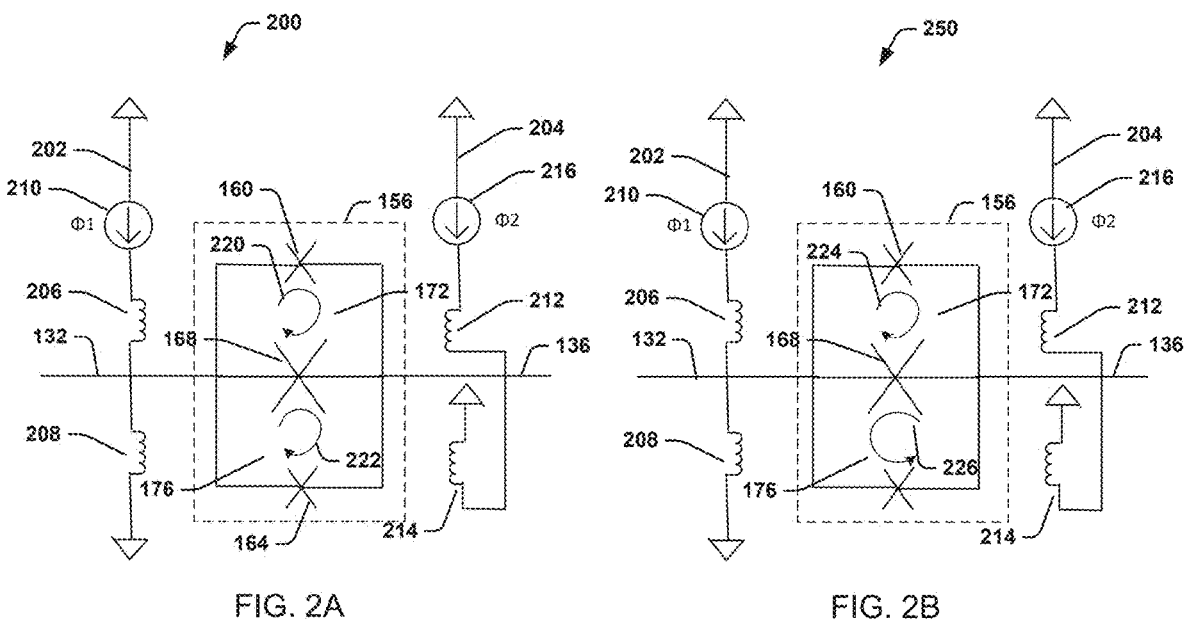
FIG. 2A illustrates an example tunable coupler circuit with a first flux applied.
FIG. 2B illustrates an example tunable coupler circuit with a second flux applied.

FIG. 2A illustrates an example tunable coupler circuit 200 with a first flux applied. In some examples, the tunable coupler circuit 200 is same as the tunable coupler circuit 128 in FIG. 1, and therefore, the same numbering is used to depict the same structure. However, it is noted herein that not all the features depicted in the tunable coupler circuit 128 is depicted in the tunable coupler circuit 200 for the case of reference. Further, all the features of the tunable coupler circuit 128 in FIG. 1 are also applicable to the tunable coupler circuit 200 in FIG. 2A and is therefore, not repeated herein. The tunable coupler circuit 200 includes a three-junction superconducting quantum interference device (SQUID) 156 coupled between the first transmission line 132 and the second transmission line 136. The three-junction SQUID 156 includes a first Josephson Junction (JJ) 160, a second JJ 164 and a center JJ 168 coupled in parallel to one another such that the first JJ 160 and the center JJ 168 forms a first loop 172 and the second JJ 164 and the center JJ 168 forms a second loop 176.

The tunable coupler circuit 200 further includes a first bias line 202 configured to apply a first flux $\Phi 1$ to the first loop 172 and the second loop 176. Further, the tunable coupler circuit 200 includes a second bias line 204 configured to provide a second flux $\Phi 2$ to the first loop 172 and the second loop 176. The first bias line 202 includes a first bias inductor 206 and a second bias inductor 208. The first bias line 202 also includes a first bias current source 210 configured to provide a first bias current in order to apply the first flux $\Phi 1$ to the first loop 172 and the second loop 176. The second bias line 204 includes a third bias inductor 212 and a fourth bias inductor 214. The second bias line 204 also includes a second bias current source 216 configured to provide a second bias current in order to apply the second flux $\Phi 2$ to the first loop 172 and the second loop 176.

The first flux $\Phi 1$ causes a first loop current 220 to flow in the first loop 172 and a second loop current 222 to flow in the second loop 176 such that the first loop current 220 and the second loop current 222 flow in opposite directions through the center JJ 168. In some examples, the first bias line 202 (in particular, the first bias inductor 206 and the second bias inductor 208) is positioned with respect to the first loop 172 and the second loop 176 in such a way that the first loop current 220 and the second loop current 222 induced by the first flux 1 flows in opposite directions through the center JJ 168. Therefore, when the first flux $\Phi 1$ is applied, the first loop current 220 and the second loop current 222 cancel each other at the center JJ 168.

Further, as can be seen in FIG. 2B, the second flux $\Phi2$ causes a third loop current 224 to flow in the first loop 172 and a fourth loop current 224 to flow in the second loop 176 such that the third loop current 224 and the fourth loop current 226 flow in same direction through the center JJ 168. FIG. 2B illustrates an example tunable coupler circuit 250 with a second flux applied. In some examples, the tunable coupler circuit 250 is same as the tunable coupler circuit 128 in FIG. 1 and the tunable coupler circuit 200 in FIG. 2A and therefore, the same numbering is used to depict the same structure. However, it is noted herein that not all the features depicted in the tunable coupler circuit 128 is depicted in the tunable coupler circuit 250 for the case of reference. Further, all the features of the tunable coupler circuit 128 in FIG. 1 and the tunable coupler circuit 200 in FIG. 2A are also applicable to the tunable coupler circuit 250 in FIG. 2B and is therefore, not repeated herein.

In some examples, the second bias line 204 (in particular, the third bias inductor 212 and the fourth bias inductor 214) is positioned with respect to the first loop 172 and the second loop 176 in such a way that the third loop current 224 and the fourth loop current 226 induced by the second flux $\Phi2$ flows in the same direction through the center JJ 168. Therefore, when the second flux $\Phi2$ is applied, both the third loop current 224 and the fourth loop current 226 adds up and flows through the center JJ 168. In some examples, the first flux $\Phi1$ and the second flux $\Phi2$ are applied simultaneously to the first loop 172 and the second loop 176.

Figure 3:
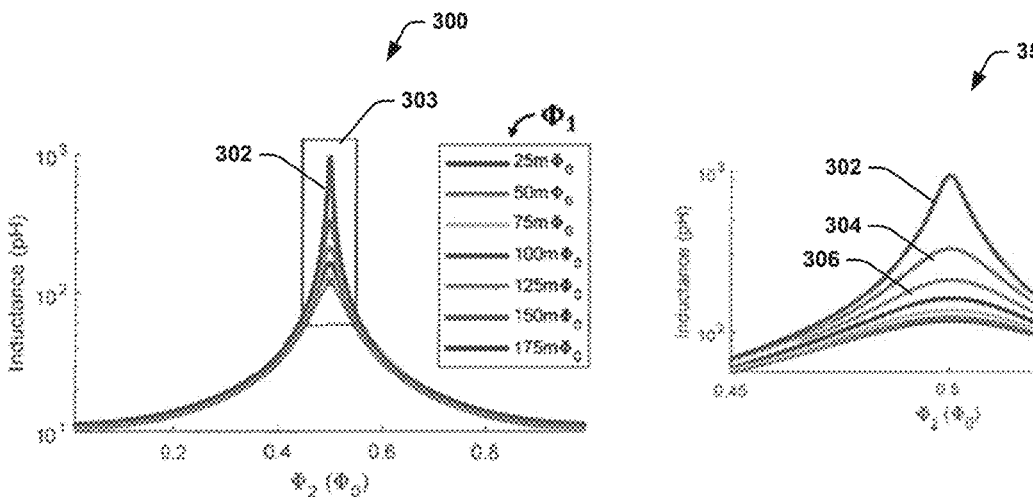
FIG. 3A depicts a graph that illustrates an example variation of effective inductance of a three-junction SQUID for various values of the first flux $\Phi 1$ and the second flux $\Phi 2$.
FIG. 3B depicts a graph that illustrates an enlarged view of the graph in FIG. 3A.

FIG. 3A depicts a graph 300 that illustrates an example variation of effective inductance of a three-junction SQUID for various values of the first flux $\Phi1$ and the second flux $\Phi2$. In some examples, the three-junction SQUID can correspond to the three-junction SQUID 156 in FIG. 1 and therefore, the graph 300 is explained herein with reference to FIG. 1. The y-axis in the graph 300 depicts the effective inductance of a three-junction SQUID and the x-axis in the graph 300 depicts the second flux $\Phi2$. Each plot in the graph 300 shows a variation of the effective inductance of the three-junction SQUID with a variation of the second flux $\Phi2$ for a certain value of the first flux $\Phi1$. For example, the plot 302 depicts a variation of the effective inductance of the three-junction SQUID with the variation of the second flux $\Phi2$ when the first flux $\Phi1$ is set to be equal to 175 m $\Phi_0$, where $\Phi_0$ is the magnetic flux quantum.

As can be seen in the plot 302, the effective inductance of the three-junction SQUID increases with an increase in the second flux $\Phi2$ up to a maximum effective inductance at the second flux $\Phi2$ equal to $0.5\Phi_0$ and then the effective inductance decreases with a further increase in the value of the second flux $\Phi2$. As can be seen in FIG. 3A, in the plot 302, for all the values of the effective inductances within the box 303, the tunable coupler circuit 128 in FIG. 1 that includes the three-junction SQUID can be in resonance with the two resonant circuits in FIG. 1. In other words, the tunable coupler circuit 128 in FIG. 1 that includes the three-junction SQUID can be in resonance with the two resonant circuits in FIG. 1 for a broad range of values of the second flux $\Phi2$, thereby achieving a broad on-state for the tunable coupler circuit 128. In some examples, the broad on-state of the tunable coupler circuit 128 is achieved because the effective inductance of the three-junction SQUID decreases after reaching the maximum effective inductance, such that the effective inductance of the three-junction SQUID remains within the box 303 for a broader range of values of the second flux $\Phi2$.

FIG. 3B depicts a graph 350 that illustrates an enlarged view of the graph 300 in FIG. 3A. In particular, the plot 302 depicts a variation of the effective inductance of the three-junction SQUID with the variation of the second flux $\Phi2$ when the first flux $\Phi1$ is set to be equal to 175 m $\Phi_0$. Similarly, the plot 304 depicts a variation of the effective inductance of the three-junction SQUID with the variation of the second flux $\Phi2$ when the first flux $\Phi1$ is set to be equal to 150 m $\Phi_0$. Further, the plot 306 depicts a variation of the effective inductance of the three-junction SQUID with the variation of the second flux $\Phi2$ when the first flux $\Phi1$ is set to be equal to 125 m $\Phi_0$.

Figure 4:
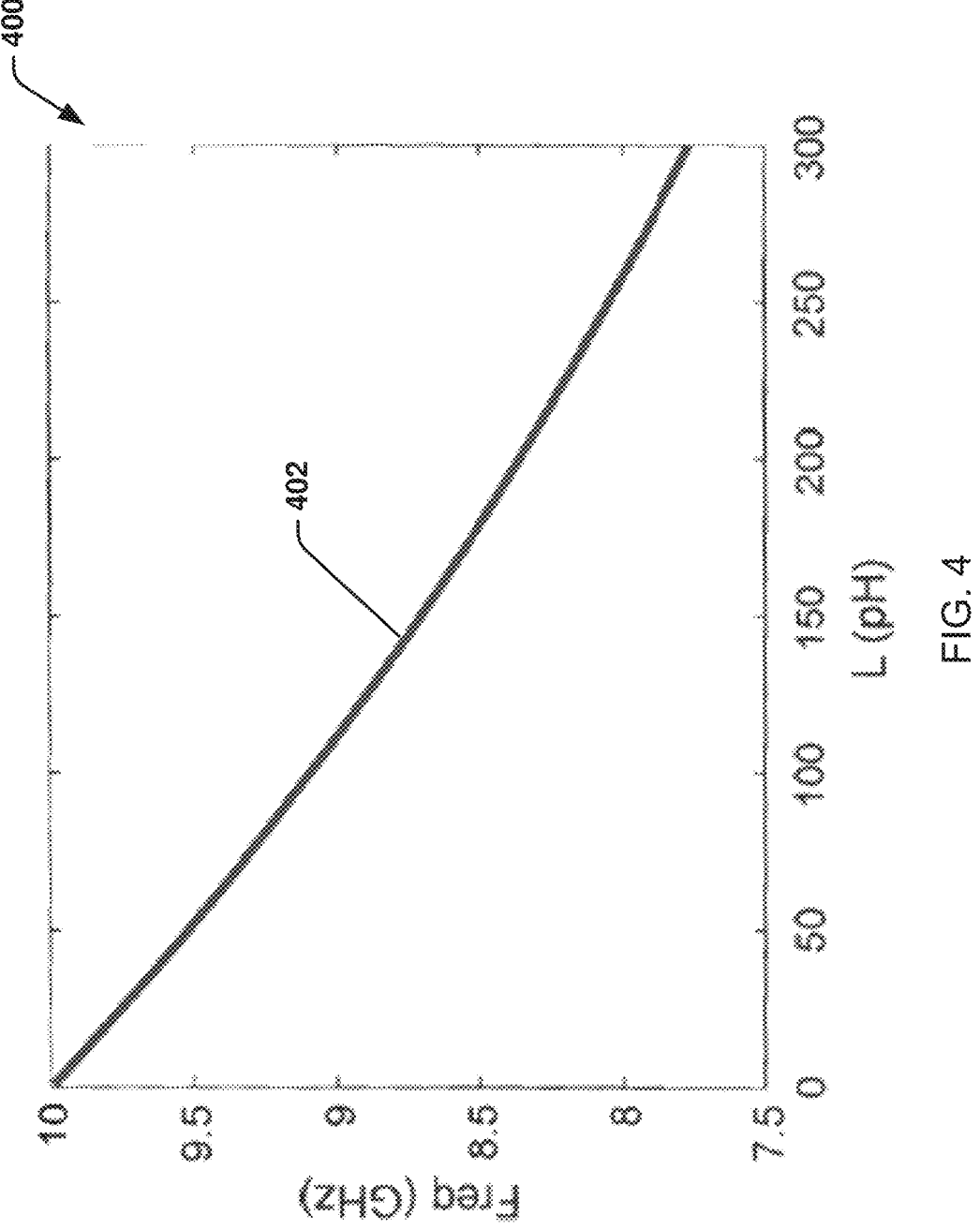
FIG. 4 depicts a graph that illustrates an example of a variation of the resonant frequency of the tunable coupler circuit in FIG. 1 with the variation of the effective inductance of the three-junction SQUID in FIG. 1

FIG. 4 depicts a graph 400 that illustrates an example of a variation of the resonant frequency of the tunable coupler circuit 128 in FIG. 1 with the variation of the effective inductance of the three-junction SQUID 156 in FIG. 1. The x-axis in the graph 400 depicts the effective inductance of the three-junction SQUID 156 and the y-axis in the graph 400 depicts the resonant frequency of the tunable coupler circuit 128. As can be seen in FIG. 4, the plot 402 shows that the resonant frequency of the tunable coupler circuit 128 decreases with an increase in the effective inductance of the three-junction SQUID 156.

Figure 5:
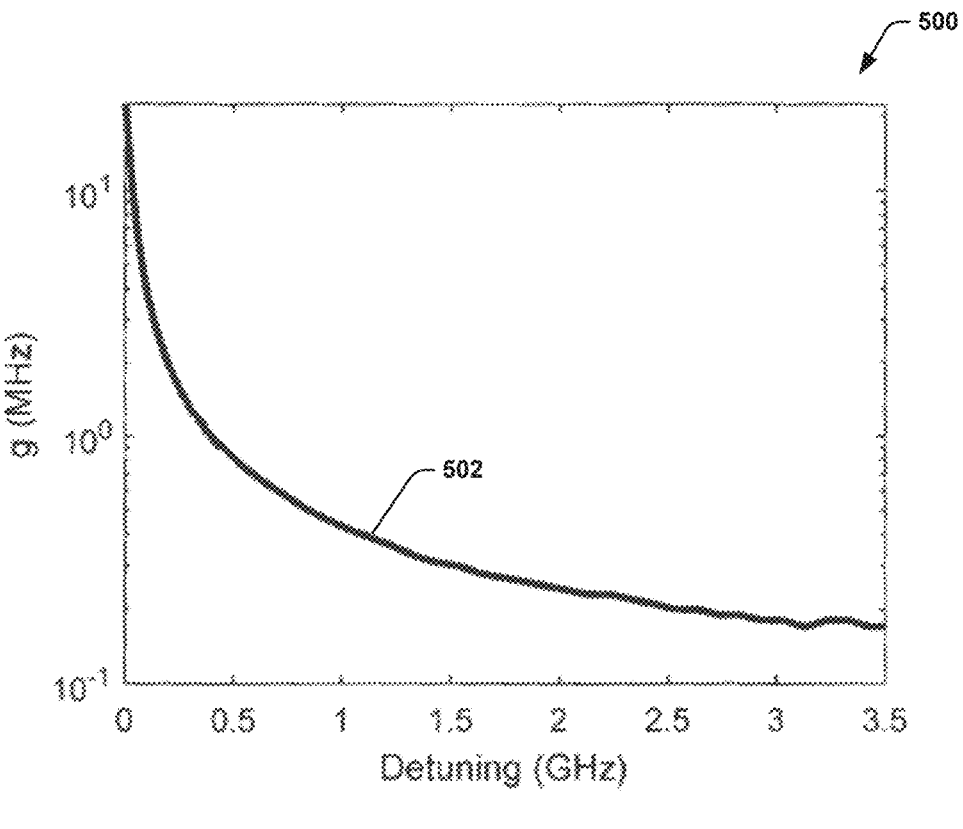
FIG. 5 depicts a graph that illustrates an example of a variation of the coupling rate (or rate of energy transfer) between the first resonant circuit and the second resonant circuit in FIG. 1 with the variation of the detuning frequency.

FIG. 5 depicts a graph 500 that illustrates an example of a variation of the coupling rate g (or rate of energy transfer) between the first resonant circuit 104 and the second resonant circuit 108 in FIG. 1 with the variation of the detuning frequency. In some examples, the detuning frequency corresponds to a difference between the resonant frequency of the tunable coupler circuit 128 in FIG. 1 and the first resonant frequency of the first resonant circuit 104 in FIG. 1 or the second resonant frequency of the second resonant circuit 108 in FIG. 1 or an average of the first resonant frequency and the second resonant frequency. The y-axis in the graph 500 depicts the coupling rate g between the first resonant circuit 104 and the second resonant circuit 108 in FIG. 1 and the x-axis in the graph 500 depicts the detuning frequency. As can be seen in FIG. 5, the plot 502 shows that the coupling rate g between the first resonant circuit 104 and the second resonant circuit 108 increases with a decrease in the detuning frequency.

What have been described above are examples of the present disclosure. It is, of course, not possible to describe every conceivable combination of components or methodologies for purposes of describing the present disclosure, but one of ordinary skill in the art will recognize that many further combinations and permutations of the present disclosure are possible. Accordingly, the present disclosure is intended to embrace all such alterations, modifications and variations that fall within the spirit and scope of the appended claims.

What is claimed is:

1. A tunable coupler circuit comprising:
   a first transmission line having a first end and a second end, the first transmission line being a quarter wavelength transmission line;
   a second transmission line; and
   a three-junction superconducting quantum interference device (SQUID) coupled between the first transmission line and the second transmission line, the three-junction SQUID including a first Josephson Junction (JJ), a second JJ and a center JJ coupled in parallel to one another such that the first JJ and the center JJ forms a first loop and the second JJ and the center JJ forms a second loop, wherein the three-junction SQUID is coupled to the second end of the first transmission line; and wherein a resonant frequency of the tunable coupler circuit is tuned based on applying a first flux and a second flux to the first and second loops.

2. The tunable coupler circuit of claim 1, wherein the second transmission line has a first end and a second end, the first end being coupled to the three-junction SQUID, and wherein the second transmission line is a quarter wavelength transmission line.

3. The tunable coupler circuit of claim 2, further comprising a first coupling capacitor coupled to the first end of the first transmission line and a second coupling capacitor coupled to the second end of the second transmission line.

4. A tunable coupler circuit comprising:
a first transmission line;
a second transmission line; and
a three-junction superconducting quantum interference device (SQUID) coupled between the first transmission line and the second transmission line, the three-junction SQUID including a first Josephson Junction (JJ), a second JJ and a center JJ coupled in parallel to one another such that the first JJ and the center JJ forms a first loop and the second JJ and the center JJ forms a second loop, and
wherein a resonant frequency of the tunable coupler circuit is tuned based on applying a first flux and a second flux to the first and second loops, the first flux causes a first loop current to flow in the first loop and a second loop current to flow in the second loop such that the first loop current and the second loop current flow in opposite directions through the center JJ, and the second flux causes a third loop current to flow in the first loop and a fourth loop current to flow in the second loop such that the third loop current and the fourth loop current flow in the same direction through the center JJ.

5. The tunable coupler circuit of claim 4, wherein the first flux determines a maximum inductance of the three-junction SQUID and the second flux determines an effective inductance of the three-junction SQUID, wherein the effective inductance is less than or equal to the maximum inductance.

6. The tunable coupler circuit of claim 5, wherein the resonant frequency of the tunable coupler circuit is determined by the effective inductance of the three-junction SQUID.

7. The tunable coupler circuit of claim 6, wherein a value of the second flux is varied for a given value of the first flux to vary the effective inductance of the three-junction SQUID.

8. The tunable coupler circuit of claim 4, wherein a sum of a critical current associated with the first JJ and a critical current associated with the second JJ is greater than a critical current associated with the center JJ.

9. The tunable coupler circuit of claim 8, wherein each of the critical current associated with the first JJ and the critical current associated with the second JJ is less than the critical current associated with the center JJ.

10. The tunable coupler circuit of claim 4, wherein the first transmission line has a first end and a second end, the second end being coupled to the three-junction SQUID, and wherein the first transmission line is a quarter wavelength transmission line.

11. The tunable coupler circuit of claim 10, wherein the second transmission line has a first end and a second end, the first end being coupled to the three-junction SQUID, and wherein the second transmission line is a quarter wavelength transmission line.

12. The tunable coupler circuit of claim 4, further comprising:
a first bias line to apply the first flux to the first and second loops; and
a second bias line to apply the second flux to the first and second loops.

13. A system comprising:
a first resonant circuit having a first resonant frequency;
a second resonant circuit having a second resonant frequency; and
a tunable coupler circuit coupled between the first resonant circuit and the second resonant circuit, the tunable coupler circuit including:
a first transmission line;
a second transmission line; and
a three-junction superconducting quantum interference device (SQUID) coupled between the first transmission line and the second transmission line, the three-junction SQUID including a first Josephson Junction (JJ), a second JJ and a center JJ coupled in parallel to one another such that the first JJ and the center JJ forms a first loop and the second JJ and the center JJ forms a second loop;
wherein a coupling rate representing a rate of energy transfer between the first resonant circuit and the second resonant circuit is varied by tuning a resonant frequency of the tunable coupler circuit.

14. The system of claim 13, wherein the coupling rate between the first resonant circuit and the second resonant circuit increases when a detuning frequency decreases, wherein the detuning frequency is the difference between the resonant frequency of the tunable coupler circuit and the first resonant frequency or the second resonant frequency or an average of the first resonant frequency and the second resonant frequency.

15. The system of claim 14, wherein the coupling rate between the first resonant circuit and the second resonant circuit decreases when the detuning frequency increases.

16. The system of claim 13, wherein the first resonant frequency and the second resonant frequency are the same.

17. The system of claim 13, wherein the resonant frequency of the tunable coupler circuit is tuned based on applying a first flux and a second flux to the first and second loops of the three-junction SQUID.

18. The system of claim 17, wherein the tunable coupler circuit further includes:
a first bias line to apply the first flux to the first and second loops; and
a second bias line to apply the second flux to the first and second loops.

19. The system of claim 17, wherein the first flux causes a first loop current to flow in the first loop and a second loop current to flow in the second loop such that the first loop current and the second loop current flow in opposite directions through the center JJ.

20. The system of claim 19, wherein the second flux causes a third loop current to flow in the first loop and a fourth loop current to flow in the second loop such that the third loop current and the fourth loop current flow in the same direction through the center JJ.

* * * * *